United States Patent [19]

Bice

[11] Patent Number: 5,398,162
[45] Date of Patent: Mar. 14, 1995

[54] CIRCUIT MODULE WITH CATCH AND RELEASE FOR DISPLACING A CANTILEVERED LATCH

[75] Inventor: Kevin L. Bice, Arvada, Colo.

[73] Assignee: AT&T Corp., Murray Hill, N.J.

[21] Appl. No.: 982,338

[22] Filed: Nov. 27, 1992

[51] Int. Cl.$^6$ .................... H05K 7/12; F16D 1/10; H01R 13/627

[52] U.S. Cl. .................... 361/732; 361/740; 361/759; 403/322; 292/209; 292/303; 439/341; 439/352

[58] Field of Search ................ 403/321, 322; 292/209, 292/210, 238, 303, 341.17, DIG. 38; 361/726, 732, 740, 754, 759, 798, 801, 810; 312/319.2, 328, 329; 439/341, 352

[56] References Cited

U.S. PATENT DOCUMENTS

| | | | |
|---|---|---|---|
| 3,969,796 | 7/1976 | Hodsdon et al. | 439/341 X |
| 4,698,024 | 10/1987 | Maxwell | 439/62 |
| 4,862,320 | 8/1989 | Schmidt . | |
| 4,881,744 | 11/1989 | Hansen | 312/328 X |
| 4,893,263 | 1/1990 | Myers | 439/352 X |
| 4,928,208 | 5/1990 | Volpe et al. . | |
| 4,972,296 | 11/1990 | Chu . | |
| 5,003,431 | 3/1991 | Imsdahl . | |

FOREIGN PATENT DOCUMENTS

| | | | |
|---|---|---|---|
| 8910111 | 10/1989 | Germany | H05K 7/02 |
| 86/04207 | 7/1986 | WIPO | H05K 5/00 |

OTHER PUBLICATIONS

Digital Equipment Corporation advertisement; Data Communications, vol. 21, No. 8, inside back cover page, May 1992; New York, N.Y.

*Primary Examiner*—Michael W. Phillips
*Attorney, Agent, or Firm*—Christopher N. Malvone

[57] ABSTRACT

A circuit module with a pivot means engages a pivot support on an equipment chassis so that the module rotates into a locked position. A cantilevered latch located on the chassis locks the module in place by engaging a catch which is located proximate to a back surface of the module. The module is released by displacing the cantilevered latch using a cam and slide assembly which are mounted on the module. The slide assembly has a handle which is accessible at the front of the module. The module is released by pulling on the handle.

12 Claims, 9 Drawing Sheets

CIRCUIT MODULE WITH CATCH AND RELEASE FOR DISPLACING A CANTILEVERED LATCH

BACKGROUND OF THE INVENTION

1. Field of the Invention

The present invention relates to electronic equipment, more particularly to circuit modules installed in a chassis.

2. Description of the Prior Art

Electronic equipment is typically arranged in a rack or chassis containing circuit modules. The circuit modules usually comprise a circuit card with electronic circuits and a protective casing surrounding the circuit card. The circuit modules also include one or more connectors that provide an electrical interface between the circuit modules and the chassis.

When upgrading or repairing electronic equipment, it is common to replace or add circuit modules. Many circuit modules are attached to an equipment chassis in a manner that makes the removal or addition of circuit modules inconvenient. Many mounting techniques require the use of specialized hardware such as screws, clips or special tools. For example, U.S. Pat. No. 4,928,208 entitled "Housing and Connection Device For Electronic Modules" discloses using a captive screw. In addition to being inconvenient, the screws and clips could accidentally fall into a circuit module and cause a short circuit. Other latching mechanisms do not require special hardware, but they are difficult to operate and sometimes require reaching into inconvenient locations.

FIG. 1 illustrates a prior latching mechanism in an unlatched position. Circuit module 2 is rotatably connected to equipment chassis 4 by engaging bracket 6 of circuit module 2 with rod 8 of equipment chassis 4. From this position, circuit module 2 rotates so that connectors 10 and 12 mate. As circuit module 2 rotates latch 14 enters opening 16 and locks the module in place.

FIG. 2 illustrates the prior electronic module latching system in a latched position. Connectors 10 and 12 are in a mated position, and latch 14 has passed through opening 16 to lock the module into a latched position. Unlatching the module requires pressing up on latch 14 so that it may pass through opening 16 as module 2 is rotated in a manner to disconnect connector 10 from connector 14. The location of latch 14 is inconvenient because it is difficult to press up on the latch when other circuit modules are mounted directly below the module to be removed.

SUMMARY OF THE INVENTION

The present invention provides a circuit module latch that is easy to operate, is located in a convenient location and does not require special hardware or tools. Additionally, the present invention's latch can be operated using only one hand.

One embodiment of the present invention provides a circuit module adapted for mating with a chassis having a cantilevered latch, where a catch supported by the module and positioned proximate to a back surface of the module interlocks with the cantilevered latch and where a release supported by the module releases the catch from the cantilevered latch.

Another embodiment of this invention provides a slidable wedge assembly that displaces the cantilevered latch and releases the module from the equipment chassis.

Yet another embodiment of the invention provides a rotatable catch mount for rotating the module's catch into a position that releases the module from the chassis.

In still another embodiment of the invention, a pivot attached to the circuit module interacts with a pivot support on the equipment chassis to allow the circuit module to be rotated into a locked position using only one hand.

DETAILED DESCRIPTION

Figure 2:
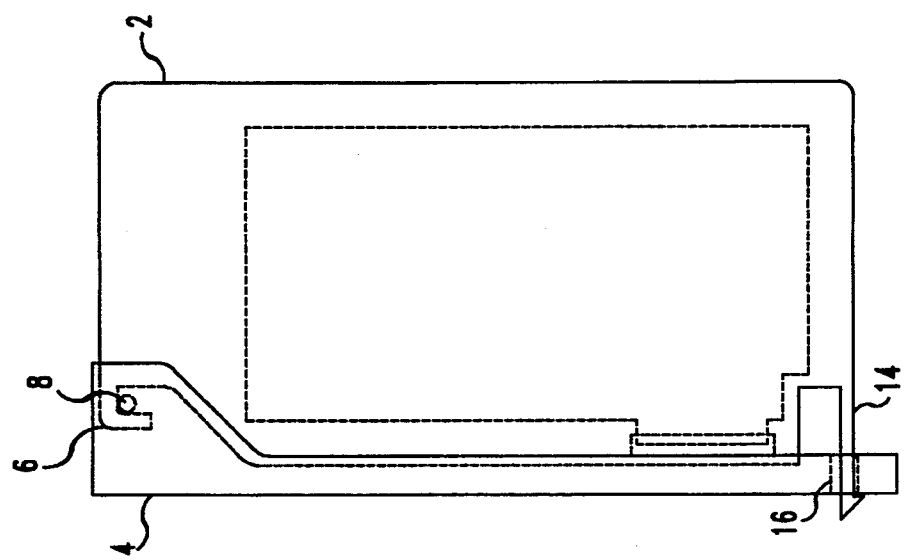
FIG. 2 illustrates the prior latching system in a latched position.
Figure 1:
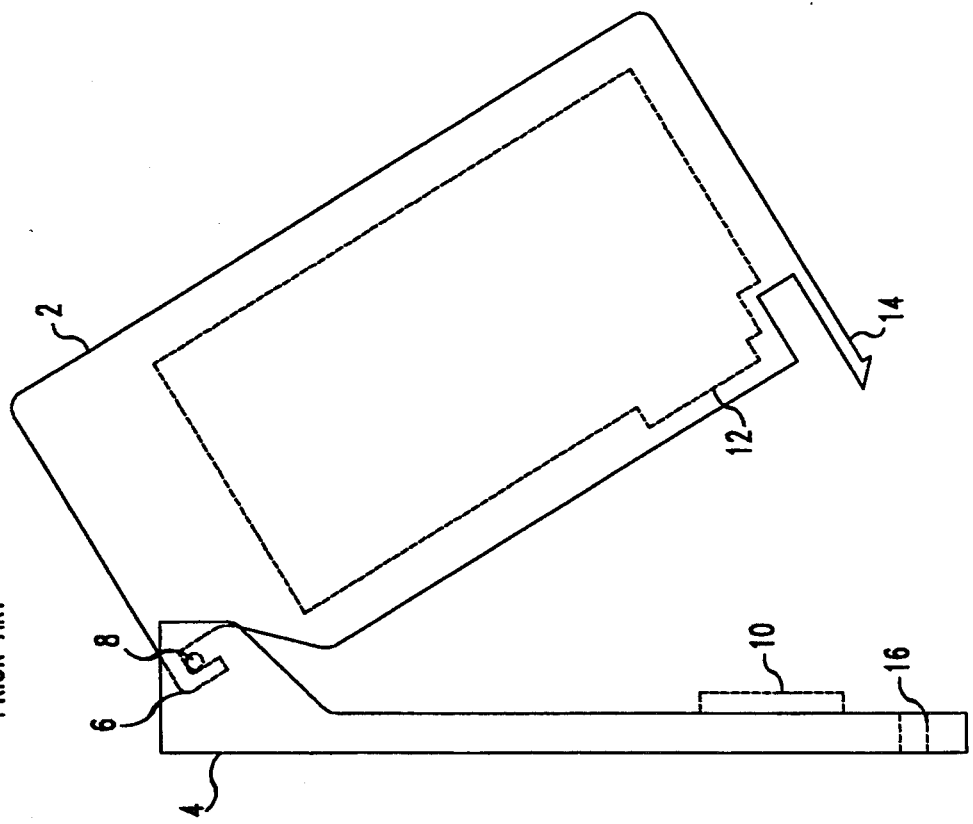
FIG. 1 illustrates a prior latching system in an unlatched position.
Figure 3:
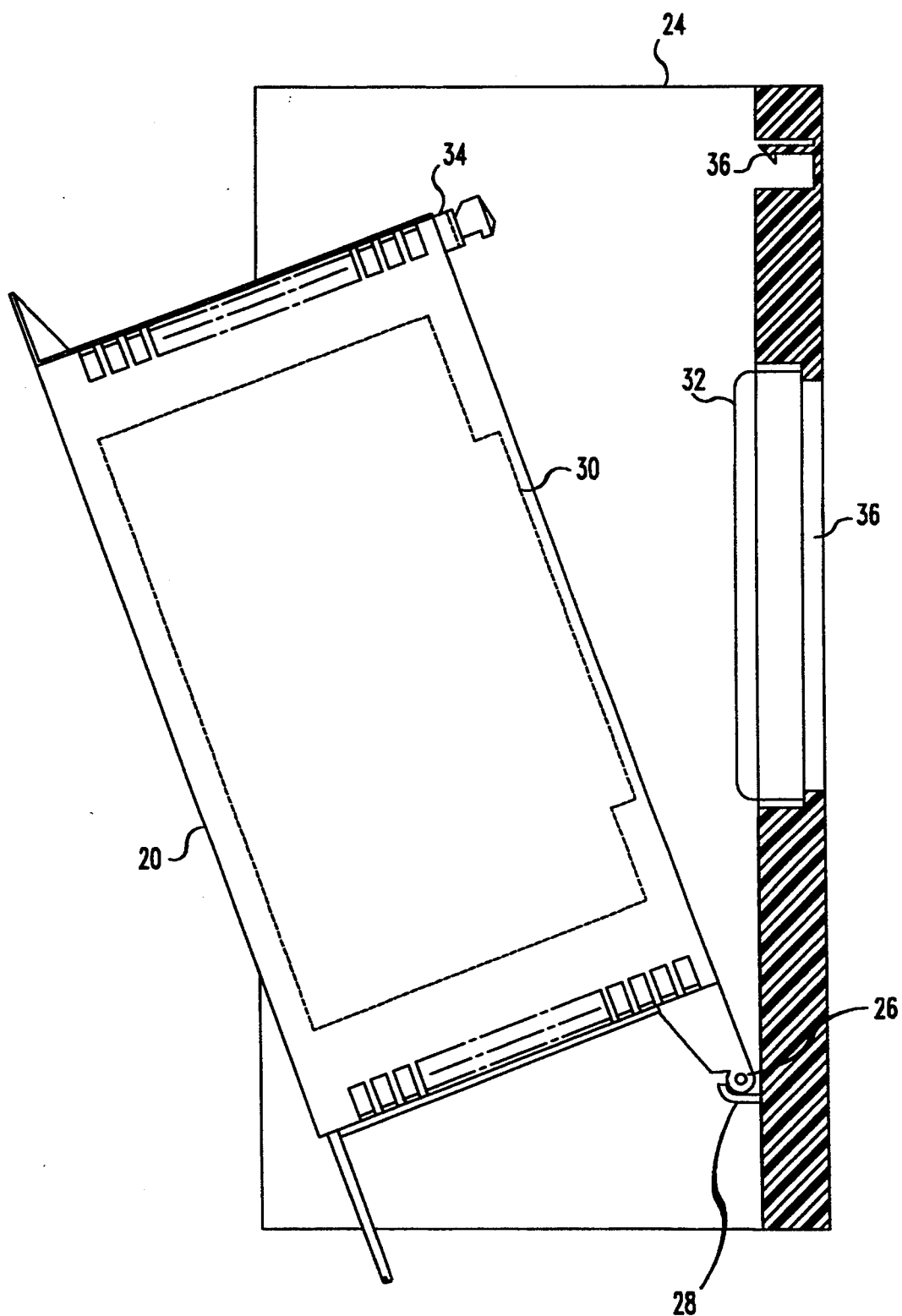
FIG. 3 illustrates the latching system of the present invention in an unlatched position.

FIG. 3 illustrates the latching mechanism of the present invention with circuit module 20 in an unlatched position. Circuit module 20 is installed in equipment chassis 24 by first placing pivot 26 into pivot support 28. Using the pivot support and pivot, electronic module 20 is rotated in a manner that causes connectors 30 and 32 to mate, and catch 34 to be captured by latch 36.

Pivot 26 and pivot support 28 can take many forms. For example, a rod may be mounted at the location occupied by support 28, and pivot 26 can be replaced with a forked or v-shaped structure that mates with the rod and allows rotation around the rod.

When using connectors that are relatively sensitive to misalignment, connector 30 should be located as far away from pivot 26 as practical. Positioning connector 30 away from pivot 26 results in the connecting surfaces of connectors 30 and 32 being in straighter alignment when the connectors make contact. When using connectors that are relatively insensitive to misalignment, connector 30 should be located closer to pivot 26. The closer location results in greater leverage which reduces the force that must be applied to make connectors 30 and 32 mate.

Opening 36 in equipment chassis 24 allows access to the back of connector 32 for providing communication with other circuit modules mounted in the chassis.

Figure 4:
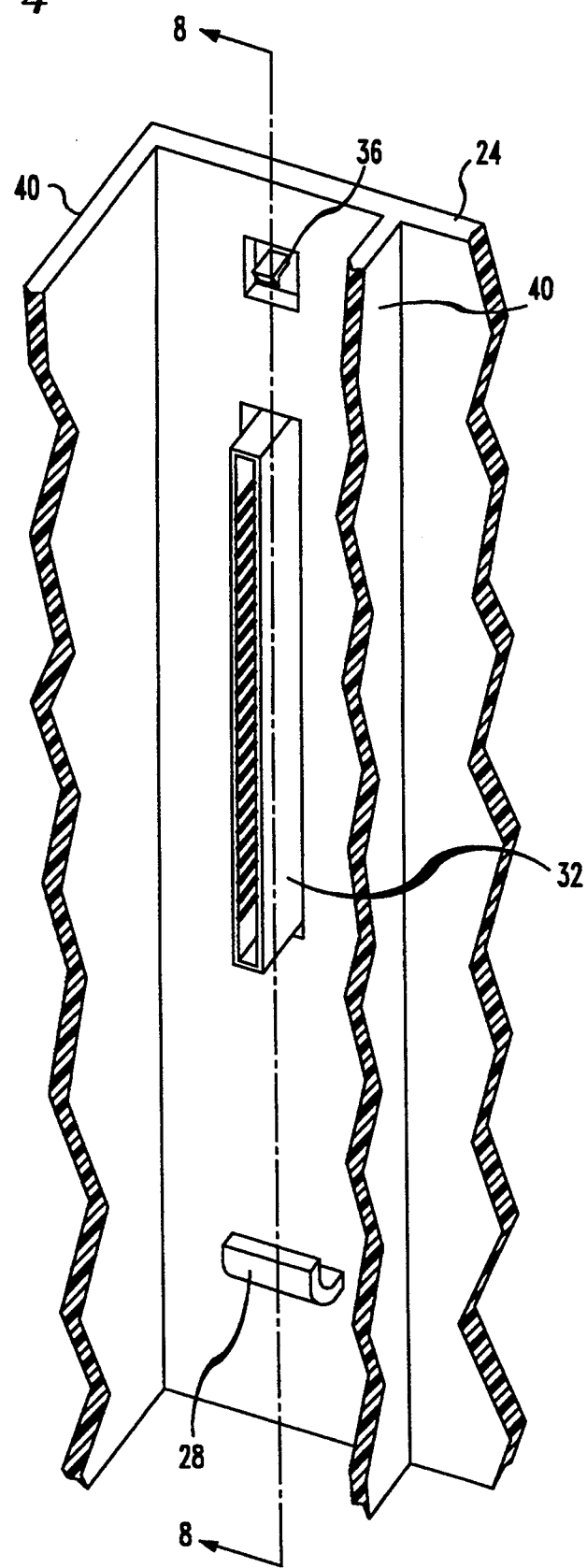
FIG. 4 illustrates the equipment chassis into which the present invention mates.

FIG. 4 is a perspective view of equipment chassis 24, and illustrates pivot support 28, connector 32 and the recessed mounting of latch 36. It also includes walls 40 that act as guides when installing the circuit module; however, chassis 24 may be constructed without walls 40.

Figure 5:
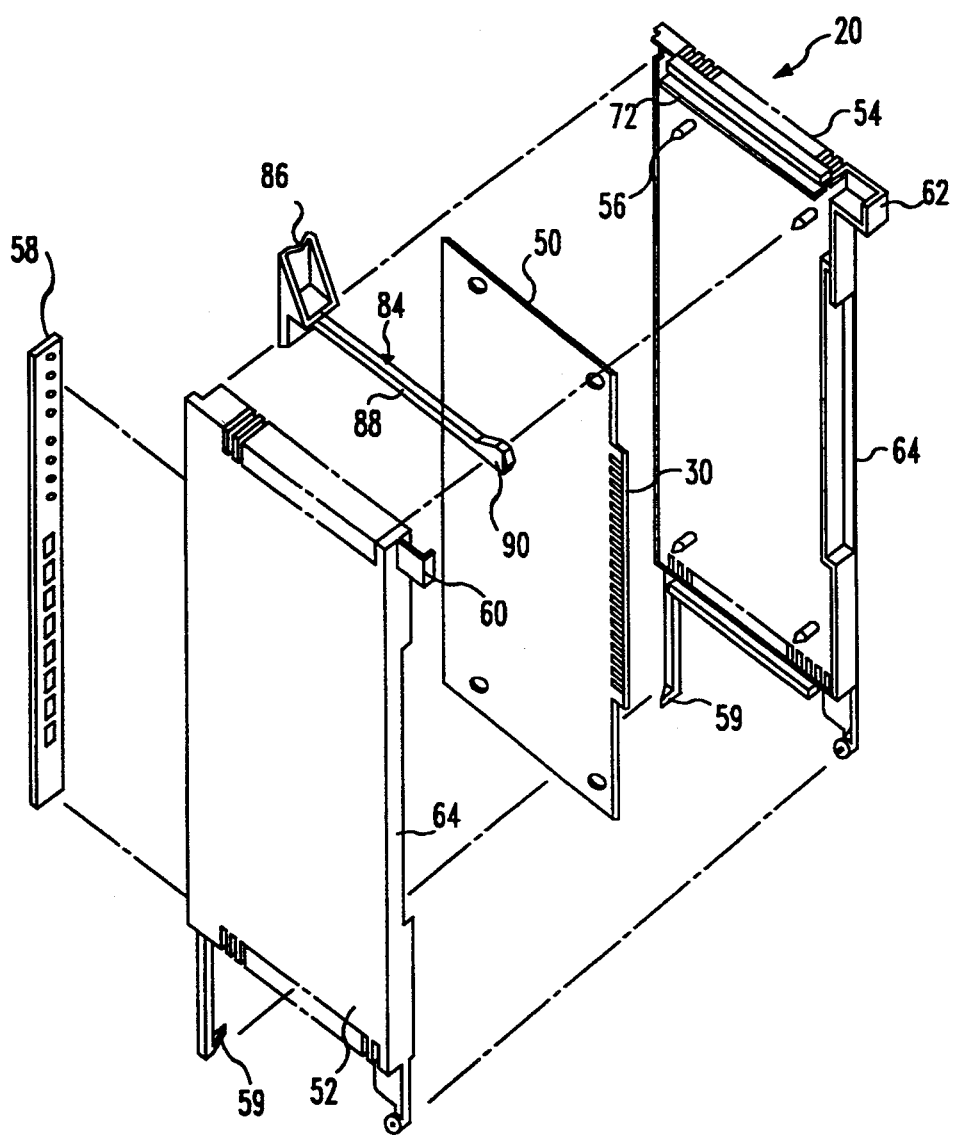
FIG. 5 is an exploded view of a circuit module.

FIG. 5 illustrates an exploded view of circuit module 20. Circuit card 50 with connector 30 is positioned between protective shells 52 and 54. Circuit card 50 is mounted on supports 56. The front of the circuit module is covered with plate 58 which may have openings for connections between circuit card 50 and cables. Cable supports 59 are provided to support the cabling that may be connected to the circuit module.

Shells 52 and 54 have catches 60 and 62, respectively, positioned on back surfaces, 64. It is also possible to position the catches on other surfaces proximate to back surface 64; however, the catches should be positioned so that they can be captured by latch 36. Shells 52 and 54 also contain tracks 72.

Slidable wedge assembly 84 moves on tracks 72. Handle 86 is accessible at the front of the circuit module and is used to move slide assembly 84. Slide member 88 connects handle 86 to wedge 90.

Shells 52 and 54, and slidable wedge assembly 84 may be constructed by high pressure injection molding a resin such as PC/ABS (Polycarbonate/Acrylonitrile Butadiene Styrene) plastic blend. Chassis 24 may be constructed by high pressure injection molding a resin such as PC (Polycarbonate) or an ABS (Acrylonitrile Butadiene Styrene) plastic. PC/ABS, PC and ABS plastics are available from General Electric Company.

Figure 6:
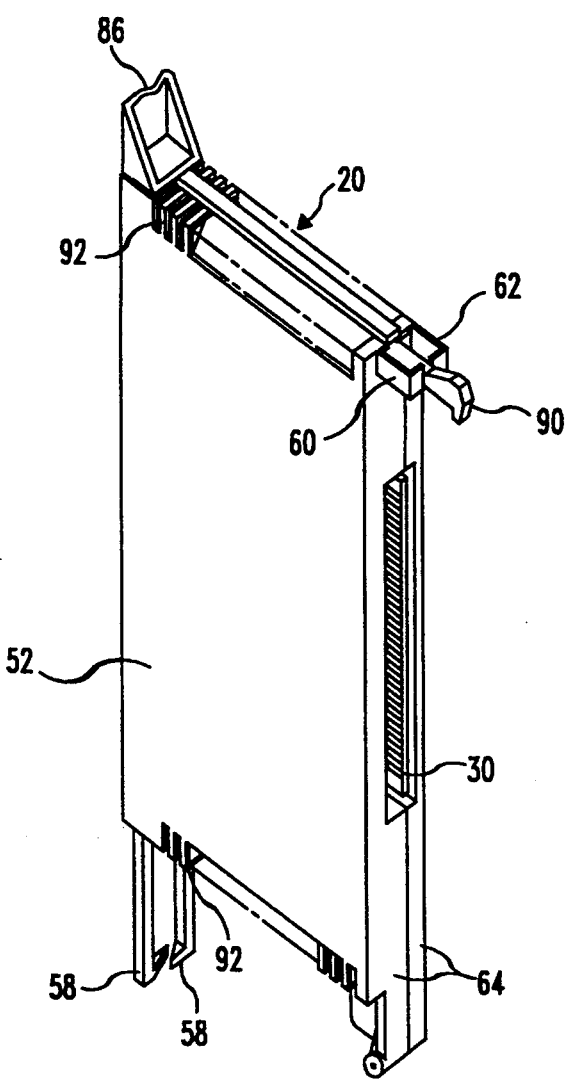
FIG. 6 is a view of an assembled circuit module.

FIG. 6 is an assembled view of the circuit module of FIG. 5. Wedge 90 is positioned between catches 60 and 62 and vents 92 permit air circulation to cool the circuits on circuit card 50.

Figure 7:
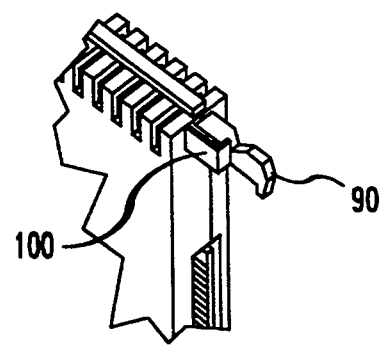
FIG. 7 illustrates another embodiment where the slidable wedge assembly is adjacent to a catch assembly.

FIG. 7 illustrates another embodiment of the present invention. In this embodiment there is a single catch 100 positioned adjacent to wedge 90.

Figure 8:
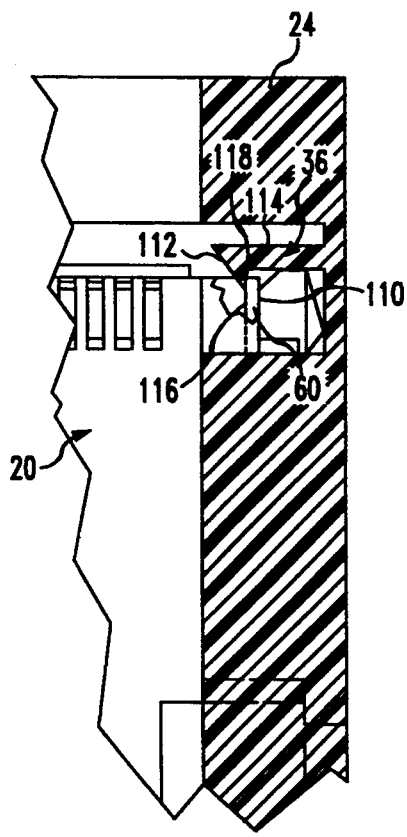
FIG. 8 is a cross-sectional view of the equipment chassis with the circuit module in a latched position.

FIG. 8 is a cross section along line 8—8 of FIG. 4 with circuit module 20 in a latched position. This view illustrates how catches 60 and 62 interact with latch 36. As circuit module 20 is rotated using pivot 26, surfaces 110 of catches 60 and 62, and surface 112 of latch 36 interact to cause a displacement of latch 36 in an upward direction as cantilevered section 114 of latch 36 bends. After surfaces 110 slip past surface 112, surfaces 116 of catches 60 and 62, and surface 118 of latch 36 interact to prevent circuit module 20 from being removed from equipment chassis 24.

Figure 9:
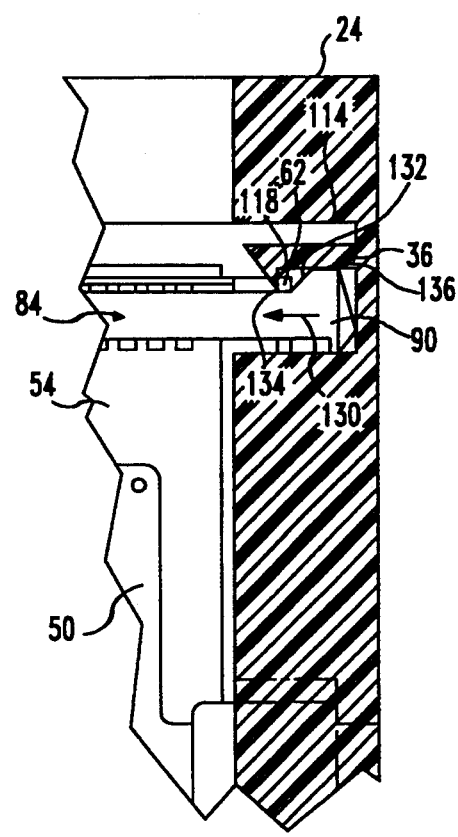
FIG. 9 is a cross-sectional view of the equipment chassis with circuit module in a latched position and with shell 52 removed for clarity.

FIG. 9 is a cross section along line 8—8 of FIG. 4 with shell 52 removed for clarity and illustrates the position of wedge 90 when circuit module 20 is in a latched position. Circuit module 20 is released from the latched position by moving wedge 90 in the direction of arrow 130. This is accomplished by pulling handle 86 of slidable wedge assembly 84. As wedge 90 moves into the direction of arrow 130, surface 132 of wedge 90 interacts with surface 134 of latch 36 to cause cantilevered section 114 to bend upward. As wedge 90 is moved further in the direction of arrow 130, latch surface 134 will rest on surface 136 of wedge 90.

Figure 10:
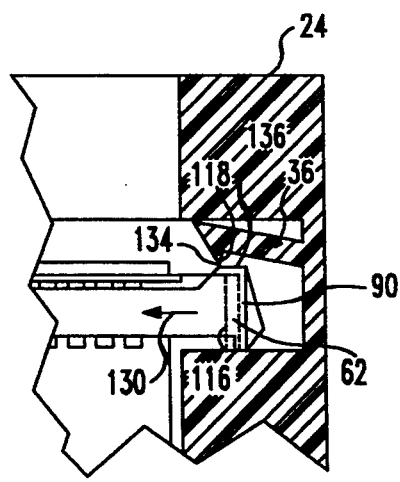
FIG. 10 is the view of FIG. 9 with the cantilevered latch being displaced by the slidable wedge assembly.

FIG. 10 illustrates latch surface 134 resting on surface 136 of wedge 90 after wedge 90 has been moved in the direction of arrow 130. When surface 134 of latch 36 rests on surface 136 of wedge 90, surface 118 of latch 36 and surfaces 116 of catches 60 and 62 no longer interact. As a result, circuit module 20 can be rotated using pivot 26 to remove the circuit module from equipment chassis 24.

Figure 11:
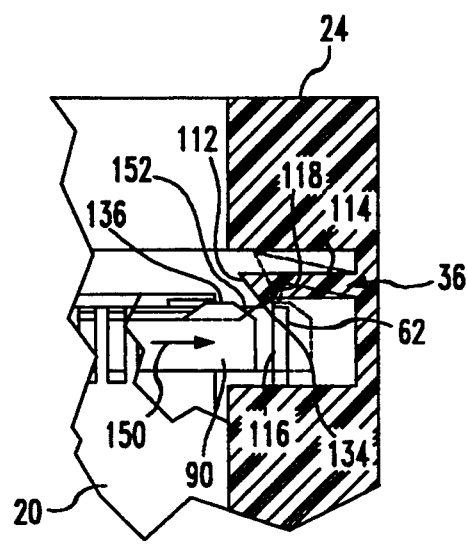
FIG. 11 illustrates another embodiment of the slidable wedge assembly.

FIG. 11 illustrates an alternate embodiment of the invention where wedge 90 is moved in the direction of arrow 150 to release circuit module 20 from equipment chassis 24. In this embodiment, surface 152 of wedge 90 interacts with surface 112 of latch 36 to displace latch 36 in an upward direction by bending cantilevered section 114 of latch 36. When wedge 90 is moved further in the direction of arrow 150, surface 134 of latch 36 rests on surface 136 of wedge 90. Once in this position, surfaces 116 of catches 60 and 62, and surface 118 of latch 36 no longer interact in a manner that holds circuit module 20 in equipment chassis 24.

Figure 12:
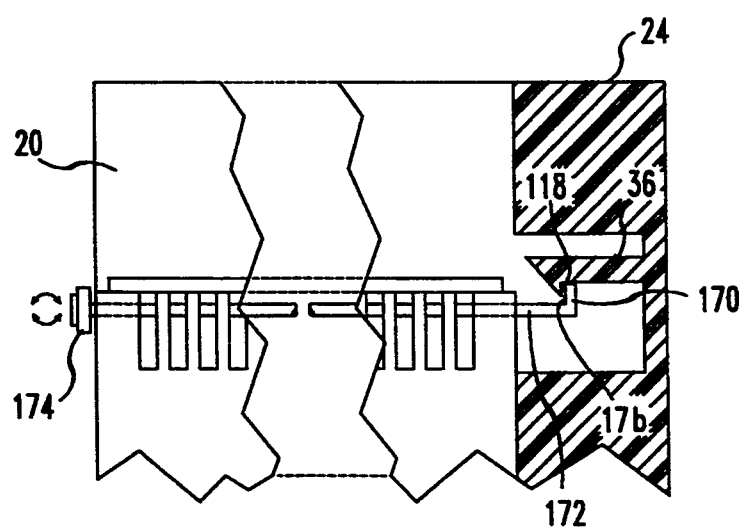
FIG. 12 illustrates the circuit module's catch mounted on a rotatable mount.

FIG. 12 illustrates another embodiment of the present invention where catch 170 is mounted to rotatable shaft 172 which is rotated using knob 174. When in a latched position, surface 118 of latch 36 interacts with surface 176 of catch 170 to lock circuit module 20 to chassis 24. When knob 174 is rotated by approximately 90 degrees, surfaces 118 and 176 no longer interact, and circuit module 20 may be removed from chassis 24.

Figure 13:
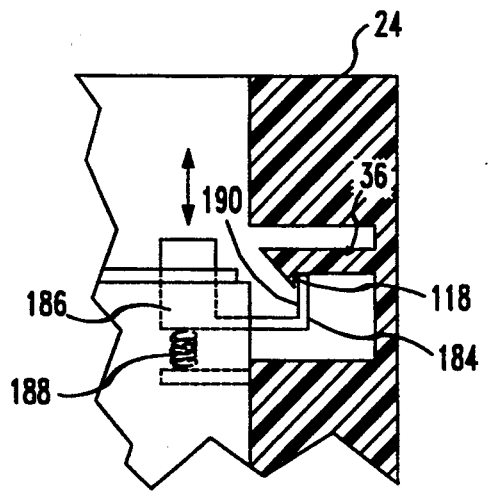
FIG. 13 illustrates the circuit module's catch mounted on a vertically slidable mount.

FIG. 13 illustrates another embodiment of the present invention where catch 184 is mounted to slidable catch mount 186. Catch 186 is held in a locking position by spring 188. When in a locking position, surface 118 of latch 36 and surface 190 of catch 184 interact to prevent the removal of circuit module 20 from chassis 24. Circuit module 20 is removed from chassis 24 by pressing downward on slidable catch mount 186 to allow catch 184 to pass below latch 36 without surfaces 118 and 190 interacting.

Figure 14:
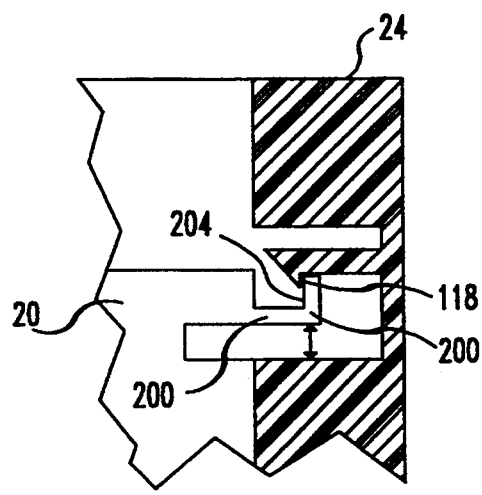
FIG. 14 illustrates the circuit module's catch mounted on a cantilevered mount.

FIG. 14 illustrates an embodiment in which catch 200 is positioned on cantilevered catch mount 202. When in a latched position, surfaces 118 and 204 interact to prevent removal of circuit module 20 from chassis 24. When cantilevered catch mount 202 is pressed downward, surfaces 118 and 204 no longer interact and circuit module 20 may be removed from chassis 24.

Figure 15:
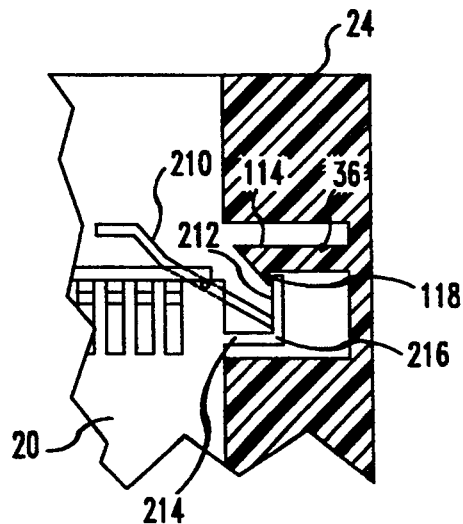
FIG. 15 illustrates a lever used for displacing the cantilevered latch.

FIG. 15 illustrates an embodiment in which lever 210 is used to displace latch 36 in a vertical direction by bending cantilevered beam 114 in a vertical direction to prevent surface 118 and surface 212 from interacting. It is also possible to move lever 210 so that cantilevered section 214 of catch 216 bends downward to prevent the interaction of surfaces 118 and 212.

Figure 16:
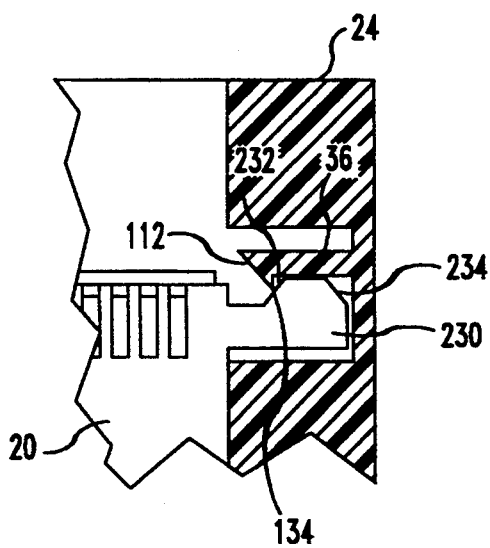
FIG. 16 illustrates the circuit module's catch with an inclined surface for displacing the cantilevered latch.

FIG. 16 illustrates an embodiment where catch 230 has surfaces 232 and 234. When circuit module 20 is inserted into chassis 24, surface 234 interacts with surface 112 of latch 36 to displace latch 36 in the vertical direction to allow catch 230 to move beneath latch 36. Circuit module 20 is removed from chassis 24 by rotating circuit module 20 using pivot 26 so that surfaces 232 and 134 interact to move latch 36 in a vertical direction. Normally there is sufficient friction between surface 232 and surface 134, and between the contacts of connectors 30 and 32 to prevent accidental removal of circuit module 20.

Figure 17:
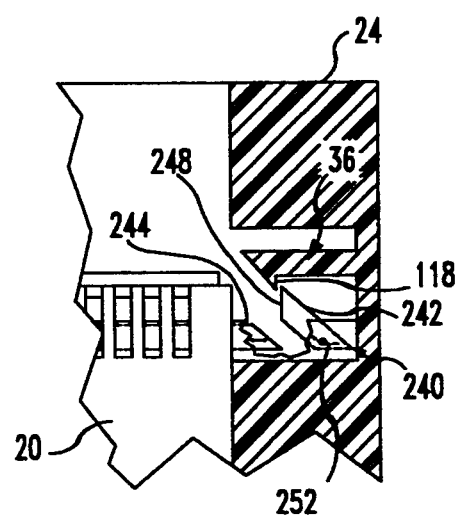
FIGS. 17 and 18 illustrate the circuit module's catch with a movable interlocking member.
Figure 18:
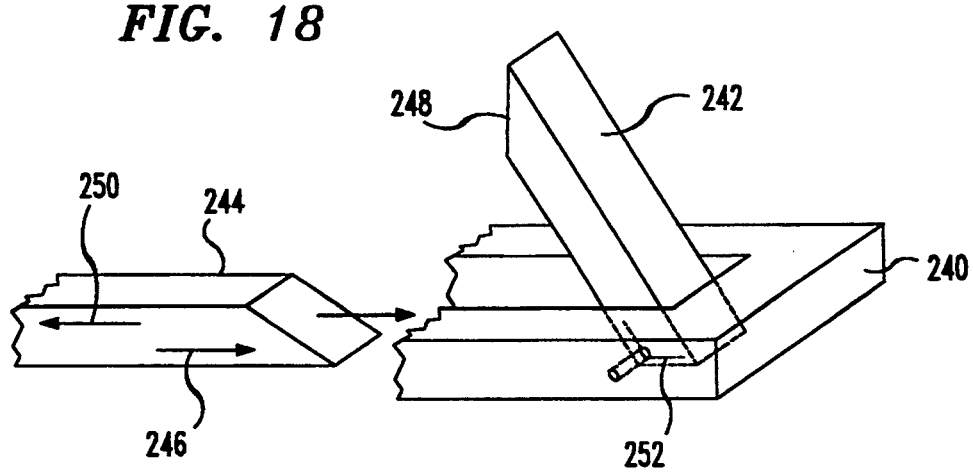

FIGS. 17 and 18 illustrate an embodiment in which catch 240 has a movable interlocking member 242. Once circuit module 20 is inserted into chassis 24, slidable member 244 is moved in the direction of arrow 246 to cause interlocking member 242 to move upward so that surface 248 interacts with surface 118 of latch 36. Slide member 244 is moved using a handle that is attached to the slide member. It is preferable to position the handle near the front of circuit module 20. Circuit module 20 is removed from chassis 24 by moving slide member 244 in the direction of arrow 250 so that interlocking member 242 can be lowered by the force of spring 252. Once interlocking member 242 has been lowered by the force of spring 252, surfaces 248 and 118 no longer interact and circuit module 20 can be removed from chassis 24.

I claim:

1. A circuit module adapted for mating with a chassis having a cantilevered latch, said circuit module comprising:
    catch means supported by said module and positioned proximate to a back surface of said module for interlocking with the cantilevered latch; and
    release means supported by said module for releasing said catch means from the cantilevered latch by displacing the cantilevered latch.

2. The circuit module of claim 1, wherein said release means comprises slidable wedge means for displacing the cantilevered latch so that said catch means is released from the cantilevered latch.

3. The circuit module of claim 1, wherein said release means comprises lever means for displacing the cantilevered latch so that said catch means is released from the cantilevered latch.

4. A circuit module adapted for mating with a chassis having a cantilevered latch and a pivot support, said circuit module comprising:
    pivot means supported by said module for interacting with the pivot support to permit said module to rotate about an axis parallel to a reference axis normal to a side surface of said module;
    catch means supported by said module and positioned proximate to a back surface of said module for interlocking with the cantilevered latch; and
    release means supported by said module for releasing said catch means from the cantilevered latch by displacing the cantilevered latch.

5. The circuit module of claim 4, wherein said release means comprises slidable wedge means for displacing the cantilevered latch so that said catch means is released from the cantilevered latch.

6. The circuit module of claim 4, wherein said release means comprises lever means for displacing the cantilevered latch so that said catch means is released from the cantilevered latch.

7. A circuit module adapted for mating with a chassis having a cantilevered latch and a pivot support, said circuit module comprising:
    pivot means supported by said module for interacting with the pivot support to permit said module to rotate about an axis parallel to a reference axis which is normal to a side surface of said module;
    catch means supported by said module and positioned proximate to a back surface of said module for interlocking with the cantilevered latch; and
    release means supported by said module for releasing said catch means from the cantilevered latch, said release means having a wedge, a slidable member and a handle, said wedge being at a first end of said slidable member and said handle being at a second end of said slidable member so that said cantilevered latch is displaced by said wedge to release said catch means when said handle is used to move said slidable member in a direction normal to said back surface of said module.

8. An electronic equipment arrangement, comprising:
    an equipment chassis having a cantilevered latch;
    a circuit module adapted for mating with said chassis;
    catch means supported by said module and positioned proximate to a back surface of said module for interlocking with said cantilevered latch; and
    release means supported by said module for releasing said catch means from said cantilevered latch by displacing the cantilevered latch.

9. The electronic equipment arrangement of claim 8, wherein said equipment chassis comprises a pivot support, and said circuit module comprises pivot means for interacting with said pivot support to permit said circuit module to rotate about an axis parallel to a reference axis normal to a side surface of said circuit module.

10. A circuit module having a connector at a first side thereof, comprising:
    pivot means supported by said module for interacting with a pivot support;
    catch means supported by said module and at said first side for interlocking with a cantilevered latch; and
    release means supported by said module and accessible at a second side of said module that is opposite said first side for disengaging said catch means from the cantilevered latch by displacing the cantilevered latch.

11. A circuit module adapted for mating with a chassis having a cantilevered latch and a pivot support, said circuit module comprising:
    catch means positioned on said module proximate to a back surface of said module for interlocking with the cantilevered latch, said catch means having an inclined surface which displaces the cantilevered latch so that said catch means is released from the cantilevered latch when said module is rotated in a direction which separates said module from the chassis; and
    pivot means supported by said module for interacting with the pivot support to permit said module to rotate about an axis parallel to a reference axis, which is normal to a side surface of said module.

12. A circuit module adapted for mating with a chassis having a cantilevered latch, said circuit module comprising:
    a catch that interlocks with the cantilevered latch and is positioned on said module proximate to a back surface of said module, said catch having an inclined surface which displaces the cantilevered latch so that said catch is released from the cantilevered latch when said module is rotated in a direction which separates said module from the chassis.

* * * * *